United States Patent [19]

Sano et al.

[11] Patent Number: 4,870,362

[45] Date of Patent: Sep. 26, 1989

[54] NUCLEAR MAGNETIC RESONANCE IMAGING METHOD AND APPARATUS

[75] Inventors: Koichi Sano; Shimbu Yamagata, both of Yokohama; Tetsuo Yokoyama, Tokyo; Hideaki Koizumi, Katsuta, all of Japan

[73] Assignee: Hitachi, Ltd., Tokyo, Japan

[21] Appl. No.: 133,069

[22] Filed: Dec. 15, 1987

Related U.S. Application Data

[63] Continuation of Ser. No. 826,250, Feb. 5, 1986, abandoned.

[30] Foreign Application Priority Data

Feb. 15, 1985 [JP] Japan .................................. 60-26241

[51] Int. Cl.$^4$ ............................................ G01R 33/20
[52] U.S. Cl. .................................... 324/312; 324/306; 324/309
[58] Field of Search ............... 324/300, 306, 307, 309, 324/312

[56] References Cited

U.S. PATENT DOCUMENTS 4,409,550 10/1983 Fossel ................................. 324/309
4,609,872 9/1986 O'Donnell ......................... 324/309
4,625,169 11/1986 Wedeen .............................. 324/309

FOREIGN PATENT DOCUMENTS 2079946 1/1982 United Kingdom .
2127155 4/1984 United Kingdom .
2150302 10/1984 United Kingdom .

OTHER PUBLICATIONS

L. E. Crooks et al., "Visualization of Cerebral and Vascular Abnormalities by NMR Imaging"; Radiology, 144:843–852.

Primary Examiner—Michael J. Tokar
Attorney, Agent, or Firm—Antonelli, Terry & Wands

[57] ABSTRACT

To display the information, as an image, regarding the moving portion of the object without the aid of the doctor, the image is reconstructed on the basis of the observed NMR signal and the image phase information is calculated from the image intensity information derived from the reconstructed image, and the phase information calculated is displayed as the image.

32 Claims, 6 Drawing Sheets

F I G. 5
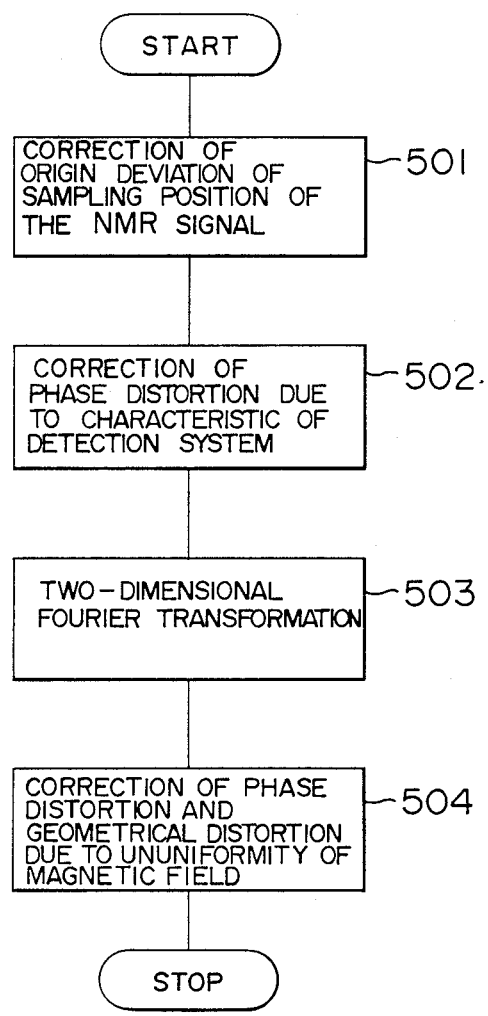

NUCLEAR MAGNETIC RESONANCE IMAGING METHOD AND APPARATUS

This is a continuation application of Ser. No. 826,250, filed Feb. 5, 1986 now abandoned.

BACKGROUND OF THE INVENTION

The present invention relates to an imaging method and apparatus for use in an apparatus for radiographing a section of a human body using a nuclear magnetic resonance (hereinafter, abbreviated as an NMR) phenomenon and is used for medical diagnosis.

After the NMR imaging was proposed by Lauterber in 1973, the imaging methods for extension and modification of the NMR imaging have been published. The proton spin density and the values of relaxation times $T_1$ and $T_2$, or the images of which the spin density was changed by the relaxation time are obtained as image information. Not only the morphological information but also the functional or biochemical information are derived due to those images; therefore, the NMR imaging is strongly expected for the malignant tumor diagnosis and energy metabolism diagnosis.

In addition, the blood flow information can be also obtained from the NMR images (L. E. Crooks et al: "Visualization of Cerebral and Vascular Abnormalities by NMR Imaging. The Effects of Imaging Parameters on Contrast", Radiology 144: 843-852). According to the NMR imaging, only the hydrogen atomic nuclei in the special slice of the human body are excited and the electromagnetic waves which are irradiated therefrom are observed. However, in the blood flow portion, the excited atoms flow out of the slice plane, so that the signal intensity decreases. The above-mentioned literature intends to know the blood flow velocity using the foregoing nature.

This method has the following drawbacks.
(1) The doctor is required to specify the location of the blood flow portion (blood vessel).
(2) There isn't the one-to-one correspondence relation between the blood flow velocity and the signal intensity.
(3) The direction of blood flow is unclear.

First, in the problem of (1), although the blood flow portion also has a specific density this density varies depending on the flow velocity. Density represents a degree of optical light and dark parts of an original image visually perceived by a human. When the original image is displayed on a screen, the image is converted into a signal intensity corresponding to the depth of monochromatic or color image in which the signal is modulated in accordance with the intensity thereof. Further, the concentration range overlaps the concentration ranges of the other portions. Therefore, the location of the blood flow portion cannot be specified from only the concentration. Therefore, the doctor needs to instruct the objective blood flow portion by observing the images.

This means that the blood flow velocity cannot be automatically measured and, further, there is a possibility such that the range and portion which are instructed by the doctor or patient change and reproducibility lacks, causing inconvenience for the time-sequential observation.

The problem of (2) is important since it further influences on the precision than the problem of (1). Although the density of the blood flow portion decrease as mentioned above, when speaking accurately, the density decreases after it has once increased (refer to the foregoing literature). This phenomenon, as shown by experimental data in FIG. 1, occurs due to the following reasons.

In the NMR imaging, the hydrogen atomic nuclei are excited and the electromagnetic waves which are irradiated therefrom are observed. This operation is ordinarily performed hundreds of times. Although it is desirable to observe after the atomic nuclei which had once been excited were returned to the normal state, this results in an increase in observation time; therefore, the observation is continued at proper time intervals. Consequently, the observation is carried out before the atomic nuclei are returned to the normal state and this causes the signal intensity to deteriorate.

However, in the blood flow portion, the excited atomic nuclei flow out of the slice plane and at the same time, the fresh atomic nuclei which were not excited in the previous observation flow into this blood flow portion. In the range of small blood flow velocity, the density once increases because of the increase in density due to the inflow of the fresh atomic nuclei rather than the reduction in density due to the outflow of the excited atomic nuclei. When the blood flow velocity exceeds a predetermined value, the influence of the outflow of the atomic nuclei becomes large and the density monotonously decreases.

In other words, the same density is presented at different blood flow velocity and there isn't the one-to-one correspondence relation between the velocity and the density (signal intensity). On the contrary, in the low blood flow velocity range, the density slightly changes and the sensitivity is also bad.

Lastly, the problem of (3) is caused when attention is paid to only the reduction of the signal intensity.

The above-mentioned problems of the conventional technology practically become various obstacles to development of the NMR imaging.

SUMMARY OF THE INVENTION

It is an object of the present invention to provide method and apparatus for displaying the velocity and direction of the blood flow portion as images automatically without requiring a doctor to specify the blood flow portion.

To accomplish this object, the present invention utilizes the fact that the NMR signal is obtained as the complex signal and has found that there is the phenomenon such that as the result of imaging of the phase information, in the portion of the blood flow, the phase changes in accordance with the velocity and the phase is reversed depending on the direction of flow. Therefore, the invention has the feature such that by the use of this phenomenon, the velocity and direction of the blood flow can be known without specifying the blood flow portion by the doctor.

The reason why this phenomenon was not found is because it was difficult to accurately obtain the phase information. Namely, even if the phase information is obtained by reproducing the images from the measured NMR signal itself, the phase is distorted due to the influences of the antenna characteristic of the detection system, unevenness of the magnetostatic field, leading characteristic of the gradient magnetic field, etc., so that the relation between the blood flow portion and the phase could not be clearly known. The applicants of this invention have developed the technology to remove those phase distortions and have discovered this phenomenon.

The pixel f(x, y) of the NMR image is the complex number and is expressed by the following polar coordinate format.

$$f(x,y) = |f(x,y)| e^{i\theta(x,y)} \quad (1)$$

In general, the NMR image indicates $|f(x, y)|$ irrespective of the spin density image or relaxation time enhanced image; however, according to the invention, new information is obtained in consideration of the phase $\theta(x, y)$.

BRIEF DESCRIPTION OF THE DRAWINGS

FIG. 5 is a flowchart showing a correction processing procedure in the case where distortions are included in the measured signal.

DESCRIPTION OF THE PREFERRED EMBODIMENTS

Figure 1:
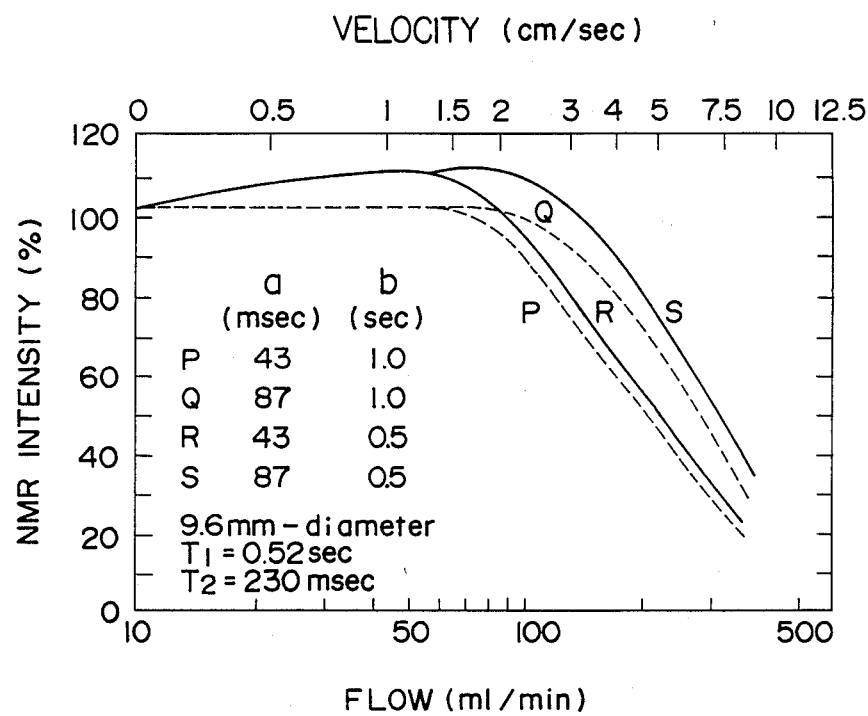
FIG. 1 is a diagram showing an example of the relation between the blood flow velocity and the density in the conventional NMR imaging.

FIG. 1 illustrates experimental data showing the phenomenon relative to the foregoing problem (2), namely, the phenomenon such that the density decreases after it increased. It will be understood from this graph that the density change is small in the range of small flow.

Figure 2:
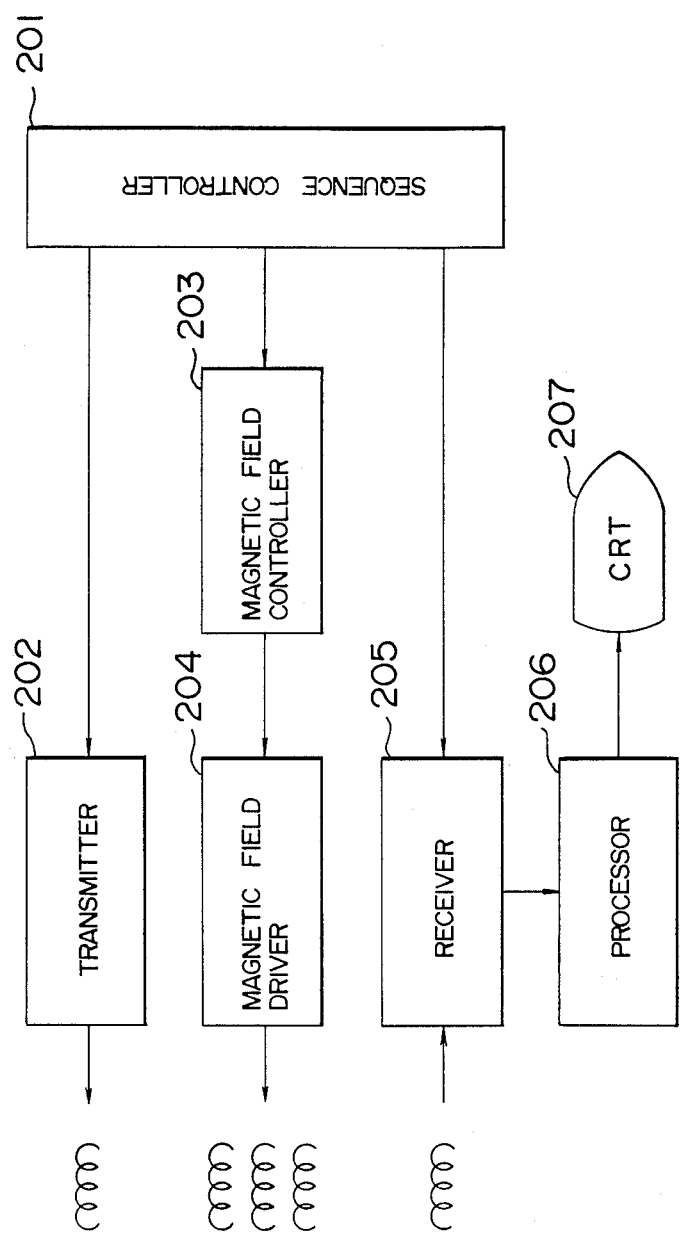
FIG. 2 is a block arrangement diagram showing an embodiment of an NMR imaging apparatus to which the invention is applied.

FIG. 2 is a block arrangement diagram of an NMR imaging apparatus to which the invention is applied. In FIG. 2, various kinds of pulses and magnetic field which are generated to detect an NMR signal from an object are controlled by a sequence controller 201. This sequence controller also controls a transmitter 202, a magnetic field controller 203, a magnetic field driver 204, and a receiver 205. The transmitter 202 generates a high frequency pulse to cause the resonance of the special nuclear species of the object. The magnetic field controller 203 generates the magnetostatic field which determines the resonance frequency of the NMR signal and the gradient magnetic field and intensity and direction of which can be arbitrarily controlled. The magnetic field driver 204 generates the magnetic field necessary for measurement on the basis of a control signal which is outputted from the controller 203. The receiver 205 detects the NMR signal which is generated from the object and thereafter performs the measurement. A processor 206 reconstructs the image on the basis of the measurement signal supplied from the receiver 205. The image as the result of the process by the processor 206 is displayed on a CRT display 207.

Figure 3:
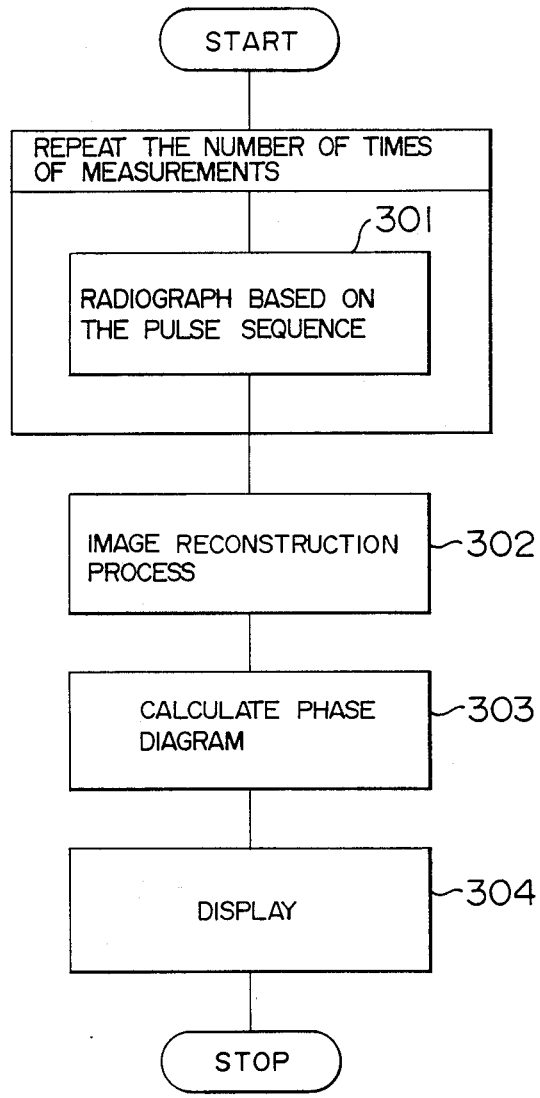
FIG. 3 is a flowchart showing a processing procedure of the invention under the ideal state in which no distortion is included in the measured signal.
Figure 4:
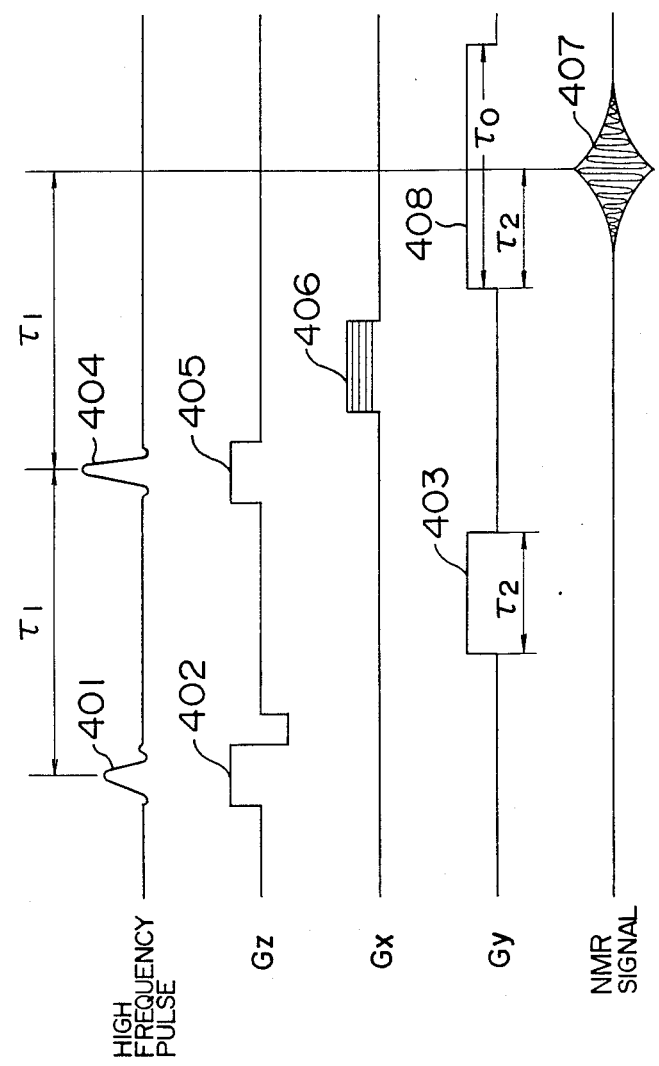
FIG. 4 is a diagram showing an example of a pulse sequence as a radiographing procedure for embodying the invention.
Figure 6:
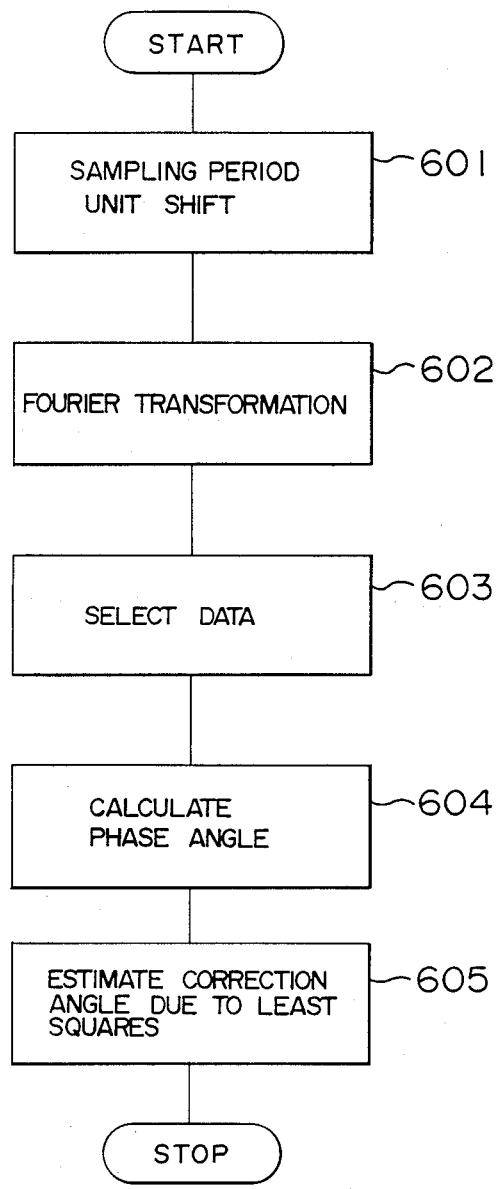
FIG. 6 is a flowchart showing a processing procedure to calculate a deviation amount of the position of the origin in the distortion correction.

An embodying procedure of the invention in the above arrangement will then be described hereinbelow with reference to FIGS. 3 to 7. FIG. 3 is a flowchart showing a processing procedure for displaying the blood flow portion according to the invention. In this case, an explanation will be made with respect to an example in which the image is reconstructed using a two-dimensional Fourier transformation method on the basis of the pulse sequence due to a spin echo method. The case where the image is reconstructed using a projection reconstruction method may be also applied on the basis of the same idea. FIG. 4 shows the pulse sequence of the two-dimensional Fourier transformation method.

STEP 301:

An NMR signal 407 is measured 256 times in accordance with the pulse sequence of FIG. 4. Namely, (1) A high frequency pulse (90° pulse) 401 including the frequency component which can select the special slice when a gradient magnetic field ($G_z$) 402 is applied is irradiated from the transmitter 202. Due to this pulse, only the nuclear spin in the special slice is inclined by 90°.

(2) After an expiration of time $\tau_1$, a 180° pulse 404 is applied from the transmitter 202 in order to generate the spin echo. In this case as well, however, the gradient magnetic field ($G_z$) 402 is applied from the magnetic field driver 204 and the same slice as that when the 90° pulse was applied is selected. An gradient magnetic field ($G_y$) 403 is applied from the driver 204 in the direction of y for only time $\tau_2$ within time $\tau_1$. Time $\tau_2$ is just half of observation time time $\tau_0$ of the NMR signal 407. The reason why the gradient magnetic field 403 is applied is to match the position of the sampling origin of the NMR signals.

The spin in the slice is reversed by 180° by the 180° pulse 404.

(3) A gradient magnetic field ($G_x$) 406 is applied in the direction of x during generation of the NMR signal 407 which is observed after time $\tau_1$ from the 180° pulse 404 in order to add the phase information corresponding to the position to the observed signal. The intensity of $G_x$ is sequentially changed when the observation is repeatedly performed.

(4) A gradient magnetic field 408 is applied in the direction of y after time $(\tau_1 - \tau_2)$ from the 180° pulse 404 and the NMR signal 407 is observed by way of the receiver 205. The observed signal is orthogonally detected and thereafter it is sent to the processor 206.

In the above procedure, the gradient magnetic fields $G_x$, $G_y$ and $G_z$ are controlled by the magnetic field controller 203.

STEP 302:

The signal derived after the orthogonal detection is subjected to distortions due to various factors. The following three distortions largely influence the phase information.

(i) Deviation of the origin of the sampling position of the NMR signal.
(ii) Characteristic of the detection system.
(iii) Unevenness of the magnetic field.

The two-dimensional Fourier transformation is performed while correcting those distortions, thereby reconstructing the image. This process will be described in detail hereinafter.

STEP 303:

The NMR image which is derived in STEP 202 becomes the complex signal shown in the following expression.

$$f(x,y) = f_R(x,y) + if_I(x,y) \tag{2}$$

In the case where the object to be radiographed doesn't include any moving portion such as blood flow or the like, after the distortion corresponding processes were executed in STEP 302, the imaginary part $f_I(x, y)$ component is zero. Thus, we have $$\begin{cases} f(x, y) = f_R(x, y) & (3) \\ Ang\{f(x, y)\} = \arctan\left(\dfrac{f_I(x, y)}{f_R(x, y)}\right) = 0 & (4) \end{cases}$$

On the contrary, in the case where the object to be radiographed includes the moving portion such as blood flow or the like, the phase change proportional to the velocity of this moving portion occurs as mentioned above. Therefore, the imaginary part also has a value and the phase $\theta(x, y)$ at this time is obtained by the following expression $$\theta(x, y) = \operatorname{sgn}(f_I(x, y)) \arccos\left\{ \dfrac{f_R(x, y)}{\sqrt{f_R^2(x, y) + f_I^2(x, y)}} \right\} \tag{5}$$

This is called a phase diagram.

STEP 304:

The phase diagram obtained in STEP 303 is directly displayed as the light/dark image on the CRT display 207. In this case, the image in the still region is displayed at the middle density and the image in the moving region such as the blood flow is displayed as a somewhat black image or a somewhat white image in dependence on the direction of blood flow. For example, by assigning one or two colors among three primary colors (R, G, B) to the information regarding the movement and assigning the residual color to the real part of the intensity information, it is possible to display the image such that the moving portion such as blood flow or the like is colored by the color different from the others.

On one hand, by displaying the phase diagram as the absolute value, the image in the still region is displayed as the black image and the image in the moving region is displayed as the white image.

Further, for example, by assigning one or two colors among three primary colors (R, G, B) to the real part of the intensity information in place of the phase information and assigning the residual color to the absolute value of the intensity information, it is possible to display the image such that only the moving portion such as blood flow or the like is colored.

In addition, by performing the false color display, it is possible to clearly display the moving portion together with its direction which can be seen with half an eye.

The general processing procedure excluding the distortion processes has been explained above.

In the ideal case without any distortion, the above procedure is sufficient. However, in the case where some distortions are included in the measured signal, it is necessary to carry out the reconstruction process including the processes to correct those distortions. FIG. 5 shows a flowchart for the processing procedure in such a case.

STEP 501:

The origin of the time base of the NMR signal 407 detected by the receiver 205 should inherently start after time $2\tau_1$ from the 90° pulse. However, it is slightly deviated due to causes of the leading characteristic of the gradient magnetic field and the like. When the gradient magnetic field ($G_x$) 406 is not applied, the real part of the measured data becomes an even function and the imaginary part becomes an odd function. By use of this nature, the time deviation is detected and the observed data is corrected. A detecting method in this case will be explained in detail hereinafter.

STEP 502:

Attention is paid to the origin of the NMR data corrected in STEP 501. When the phase of the observed signal coincides with the phase of the detected signal, the value of the real part of the origin of the measured data when the gradient magnetic field ($G_x$) 406 is not applied is positive and the value of the imaginary part is zero. However, in general, this condition is not satisfied since the phase varied due to the characteristic of the detection system. Therefore, the calculation angle is obtained on the basis of the following expression.

$$\theta = \operatorname{sgn}(g_I(0,0)) \arccos(\alpha)$$

where, $$\alpha = \dfrac{g_R(0, 0)}{\sqrt{g_R^2(0, 0) + g_I^2(0, 0)}}$$

$$0 < \cos^{-1}(\alpha) < \pi \cdot \cdot$$

and $g(0, 0)$ is a value when $G_x = 0$ and $t = 0$.

The correction of the following expressions is performed using the angle $\theta$ obtained with respect to all observed data.

$$\begin{cases} \widetilde{g_R}(x, t) = g_R(x, t)\cos\theta + g_I(x, t)\sin\theta \\ \widetilde{g_I}(x, t) = -g_R(x, t)\sin\theta + g_I(x, t)\cos\theta \\ \widetilde{g}(x, t) = \widetilde{g_R}(x, t) + i\widetilde{g_I}(x, t) \end{cases} \tag{7}$$

STEP 503:

Two-dimensional Fourier transformation is performed using the observed data derived in STEP 502. Namely, $$F[\widetilde{g}(x, t)] = f(x, y) = f_R(x, y) + if_I(x, y) \tag{8}$$

The result becomes the NMR image.

STEP 504:

Assuming that the uneven magnetic field is $E(x, y)$, there is the following relation between the image $\widetilde{f}(x, y)$ which is reconstructed at this time and the image $f(x, y)$ when $E(x, y) = 0$.

$$\widetilde{f}\left(x + \dfrac{1}{G_x} E(x, y)\right) = f(x, y) \dfrac{\exp[2\pi i \gamma E(x, y) t]}{1 + \dfrac{1}{G_x} \dfrac{\partial E(x, y)}{\partial x}} \tag{9}$$

where, $\gamma$: nuclear magnetic rotation ratio $t$: time under the uneven magnetic field Therefore, it is sufficient to correct the following three distortions.

(1) Geometrical distortion of $$x' = x + \frac{1}{G_x} E(x, y)$$

(2) Concentration distortion of $$1 / \left[ 1 + (1/G_x)x \frac{\partial E(x, y)}{\partial x} \right]$$

(3) Phase change of $2\pi\gamma E(x, y)t$

This correction can be easily performed if $E(x, y)$ is known. Refer to the following literature for details. (Image restoration from non-uniform magnetic field influence for direct Fourier NMR imaging, Phys. Med. Biol. 1984, Vol. 29, No. 1, 15–24)

There are three kinds of methods of performing the correction after detecting the origin deviation in STEP 501.

(1) After the measured data was converted due to a one-dimensional Fourier transformation method, the phase correction in proportion to the frequency is executed and the measured data is then returned due to an inverse Fourier transformation.

(2) The measured data is resampled by a sinc function.

(3) The phase correction proportional to the position is performed in the direction of x of the reconstructed image.

Although the similar effects are obtained in any of those methods, the method of (3) is most suitable in terms of the calculation time. The phase linearly changes in dependence on the position. When the angle of inclintion assumes $\alpha$, the image is corrected on the basis of the following expression.

$$\begin{cases} f_R(x, y) = f_R(x, y) * \cos\alpha x + f_I(x, y) * \sin\alpha x \\ f_I(x, y) = f_R(x, y) * \sin\alpha x + f_I(x, y) * \cos\alpha x \end{cases} \quad (10)$$

Where, $f(x, y) = f_R(x, y)$ denotes the image after correction.

The distortion correction processing procedure has been described above. The detailed procedure for the process to correct the origin deviation in STEP 501 will then be explained hereinbelow with reference to a flowchart of FIG. 6. The measured data $g(0, t)$ when the gradient magnetic field $G_x$ is not applied is to be processed. This data is written as $g(t)$ for simplicity of explanation hereinafter. When it is assumed that this data is the turn signal, the signal which is actually measured is deviated by only time $\alpha_1$. Namely, it is expressed by $g(t-\alpha_1)$.

STEP 601:

The sampling point where the sampled signal intensity has a peak value is set at the origin position. Due to this process, the origin position deviation becomes one sampling point or less and the signal becomes $g(t-\alpha)$ (where $\alpha$ is shorter than the sampling period).

STEP 602:

The measured data $g(t-\alpha)$ is Fourier transformed. Namely, $$F[g(t-\alpha)] = G(x)e^{-i\alpha x} = \hat{G}(x) \quad (11)$$

where, $F[g(t)] = G(x)$ $G(x)$ is the real number value due to the nature of $g(t)$.

STEP 603:

For every sampling point of x in expression (11), $$\text{Ang}[G(x)e^{-i\alpha x}] = -\alpha x \quad (12)$$

is obtained. Since the noises are ordinarily multiplexed, the observation phase $\beta(x_i)$ becomes $$\beta(x_i) = -\alpha x_i + n_i \quad (13)$$

where, $n_i$ denotes the noises.

Since it is considered that the reliability of the value of $(x_i)$ is almost proportional to the magnitude of amplitude $G(x_i)$, only the sampling points $x_i$ of which the magnitudes of $G(x_i)$ is over a predetermined value are selected.

STEP 604:

The phase angle $\beta(x_i)$ is obtained on the basis of the following expression with respect to $x_i$ selected in STEP 603.

$$\beta(x_i) = \text{sgn}(\widetilde{G}_I(x_i))\text{arc cos} \left( \frac{\hat{G}_R(x_i)}{\sqrt{\widetilde{G}_R^2(x_i) + \widetilde{G}_I^2(x_i)}} \right) \quad (14)$$

where, $\widetilde{G}(x) = \widetilde{G}_R(x) + i\widetilde{G}_I(x)$

STEP 605:

The angle of inclination $\alpha$ is estimated due to an estimation method of least squares. Namely, the angle $\alpha$ is calculated by the following expression.

$$\alpha = \frac{\sum\limits_{x_i \in \Omega} 1 \cdot \sum\limits_{x_i \in \Omega} \{\beta(x_i) \cdot x\} - \sum\limits_{x_i \in \Omega} x_i \cdot \sum\limits_{x_i \in \Omega} \beta(x_i)}{\sum\limits_{x_i \in \Omega} x_i^2 \cdot \sum\limits_{x_i \in \Omega} 1 - \left(\sum\limits_{x_i \in \Omega} x_i\right)^2}$$

The origin deviation correction in STEP 501 is performed using $\alpha$ obtained in STEP 605 in accordance with expression (10).

The two-dimensional Fourier transformation method has been described above; however, the projection reconstruction method can be also applied in a manner similar to the above.

According to the invention, not only the blood flow portion can be automatically displayed without the aid of the doctor but also the density responsive to the velocity of the blood flow and the concentration in accordance with the velocity thereof can be displayed as the images.

Further, since the conventional density image and blood flow information can be simultaneously obtained, there is no need to prolong the radiography time. The burden to the patient is small and the use efficiency of the apparatus is also improved.

We claim:

1. A nuclear magnetic resonance imaging method comprising the steps of:

detecting a nuclear magnetic resonance signal utilizing a predetermined pulse sequence of a detection system;

converting the detected nuclear magnetic resonance signal utilizing a Fourier transformation;

calculating a phase angle on the basis of image information of a complex number obtained by the Fourier transformation;

eliminating an influence of a phase change due to at least a characteristic of the detection system and to deviation of the origin of a sampling time of the nuclear magnetic resonance signal; and converting the phase angle, having the influence of the phase change eliminated, into a signal intensity and displaying the signal intensity as an image.

2. An imaging method according to claim 1, wherein the information regarding the movement of the object which is included in the phase information calculated from said image intensity information of the complex number is displayed as the image.

3. An imaging method according to claim 2, wherein a first one of three primary colors is assigned to the real part of said image intensity information of the complex number and is displayed, and a second or third one of the three primary colors is assigned to the information regarding said movement and is displayed.

4. An imaging method according to claim 2, wherein at least one of a first and second one of three primary colors is assigned to the real part of said image intensity information of the complex number and is displayed, and a third one of the three primary colors is assigned to the absolute value of said intensity information and is displayed.

5. An imaging method according to claim 23, wherein said respective steps are executed by observing the cardiac pulsation period and synchronously with said pulsation period.

6. An imaging method according to claim 2, wherein said respective steps are executed by observing the cardiac pulsation period and synchronously with said pulsation period.

7. An imaging method according to claim 3, wherein said respective steps are executed by observing the cardiac pulsation period and synchronously with said pulsation period.

8. An imaging method according to claim 4, wherein said respective steps are executed by observing the cardiac pulsation period and synchronously with said pulsation period.

9. An imaging method according to claim 1, wherein the step of eliminating an influence of a phase change includes eliminating an influence of a phase change due to unevenness of a magnetic field.

10. An imaging method according to claim 9, wherein said respective steps are executed by observing the cardiac pulsation period and synchronously with said pulsation period.

11. A nuclear magnetic resonance imaging apparatus having a detecting system comprising:

means for detecting a nuclear magnetic resonance signal utilizing a predetermined pulse sequence;

means for converting the detected nuclear magnetic resonance signal utilizing a Fourier transformation;

means for calculating a phase angle on the basis of image information of a complex number obtained by the Fourier transformation;

means for eliminating an influence of a phase change due to at least a characteristic of the detection system and deviation of the origin of a sampling time of the nuclear magnetic resonance signal; and means for converting the phase angle, having the influence of the phase change eliminated, into a signal intensity and for displaying the signal intensity as an image.

12. An imaging apparatus according to claim 11, wherein the means for eliminating an influence of a phase change includes means for eliminating the influence of the phase change due to unevenness of a magnetic field.

13. A nuclear magnetic resonance imaging method comprising the steps of:

detecting a nuclear magnetic resonance signal utilizing a predetermined pulse sequence of a detection system;

converting the detected nulcear magnetic resonance signal to an image signal of a complex number utilizing a Fourier transformation;

calculating a phase angle on the basis of the image signal of a complex number obtained by the Fourier transformation;

eliminating an influence of a phase shift due to at least one of a characteristic of the detection system and a deviation of the origin of a sampling time of the nuclear magnetic resonance signal; and converting the phase angle, having the influence of the phase shift eliminated, into a signal intensity and displaying the image signal intensity as an image.

14. An imaging method according to claim 13, wherein the step of eliminating an influence of a phase shift includes eliminating an influence of a phase shift due to at least both a characteristic of the detection system and to a deviation of the origin of a sampling time of the nuclear magnetic resonance signal.

15. A nuclear magnetic resonance imaging method comprising the steps of:

detecting a nuclear magnetic resonance signal utilizing a predetermined pulse sequence of a detection system;

converting the detected nuclear magnetic resonance signal to an image signal of a complex number utilizing a Fourier transformation;

calculating a phase angle on the basis of the image signal of a complex number obtained by the Fourier transformation;

eliminating an influence of a phase shift due to at least one of a characteristic of the detection system and to a deviation of the origin of a sampling time of the nuclear magnetic resonance signal; and displaying an image in response to a real part of the image signal.

16. An imaging method according to claim 15, wherein the step of eliminating an influence of a phase shift includes eliminating an influence of a phase shift due to at least both a characteristic of the detection system and to a deviation of the origin of a sampling time of the nuclear magnetic resonance signal.

17. A nuclear magnetic resonance imaging method comprising the steps of:

detecting a nuclear magnetic resonance signal utilizing a predetermined pulse sequence of a detection system;

converting the detected nuclear magnetic resonance signal to an image signal of a complex number utilizing a Fourier transformation;

calculating a phase angle on the basis of the image signal of a complex number obtained by the Fourier transformation;

eliminating an influence of a phase shift due to at least one of a characteristic of the detection system and to a deviation of the origin of a sampling time of the nuclear magnetic resonance signal;

converting the phase angle, having the influence of the phase shift eliminated, into an image signal intensity; and displaying the image signal intensity as an image including displaying an image in response to a real part of the image signal intensity.

18. An imaging method according to claim 17, wherein the step of eliminating an influence of a phase shift includes eliminating an influence of a phase shift due to at least both a characteristic of the detection system and to a deviation of the origin of a sampling time of the nuclear magnetic resonance signal.

19. An imaging method according to any one of claims 13, 15 or 17, wherein information regarding movement of the object which is included in the phase angle calculated from the image signal of the complex number is displayed as the image.

20. An imaging method according to claim 19, wherein a first one of three primary colors is assigned to a real part of the image signal of the complex number and is displayed, and a second or third one of the primary colors is assigned to the information regarding the movement and is displayed.

21. An imaging method according to claim 19, wherein at least one of a first or second one of three primary colors is assigned to a real part of the image signal of the complex number and is displayed, and a third one of the three primary colors is assigned to the absolute value of the image signal and is displayed.

22. An imaging method according to claim 19, wherein the respective steps are executed by observing a cardiac pulsation period and synchronously with the pulsation period.

23. An imaging method according to any one of claims 13, 15 or 17 wherein the step of eliminating on influence of a phase shift includes eliminating an influence of a phase shift due to unevenness of a magnetic field.

24. An imaging method according to claim 23, wherein the respective steps are executed by observing a cardiac pulsation period and synchronously with the pulsation period.

25. A nuclear magnetic resonance imaging apparatus comprising:

means for detecting a nuclear magnetic resonance signal utilizing a predetermined pulse sequence of a detection system;

means for converting the detected nuclear magnetic resonance signal to an image signal of a complex number utilizing a Fourier transformation;

means for calculating a phase angle on the basis of the image signal of a complex number obtained by the Fourier transformation;

means for eliminating an influence of a phase shift due to at least one of a characteristic of the detection system and a deviation of the origin of a sampling time of the nuclear magnetic resonance signal; and means for converting the phase angle, having the influence of the phase shift eliminated, into a signal intensity and for displaying the image signal intensity as an image.

26. An imaging apparatus according to claim 25, wherein the means for eliminating an influence of a phase shift eliminates an influence of a phase shift due to at least both a characteristic of the detection system and to a deviation of the origin of a sampling time of the nuclear magnetic resonance signal.

27. A nuclear magnetic resonance imaging apparatus comprising the steps of:

means for detecting a nuclear magnetic resonance signal utilizing a predetermined pulse sequence of a detection system;

means for converting the detected nuclear magnetic resonance signal to an image signal of a complex number utilizing a Fourier transformation;

means for calculating a phase angle on the basis of the image signal of a complex number obtained by the Fourier transformation;

means for eliminating an influence of a phase shift due to at least one of a characterisitc of the detection system and to a deviation of the origin of a sampling time of the nuclear magnetic resonance signal; and means for displaying an image in response to a real part of the image signal.

28. An imaging method according to claim 27, wherein the step of eliminating an influence of a phase shift includes eliminating an influence of a phase shift due to at least both of a characteristic of the detection system and to a deviation of the origin of a sampling time of the nuclear magnetic resonance signal.

29. A nuclear magnetic resonance imaging apparatus comprising the steps of:

means for detecting a nuclear magnetic resonance signal utilizing a predetermined pulse sequence of a detection system;

means for converting the detected nuclear magnetic resonance signal to an image signal of a complex number utilizing a Fourier transformation;

means for calculating a phase angle on the basis of the image signal of a complex number obtained by the Fourier transformation;

means for eliminating an influence of a phase shift due to at least one of a characteristic of the detection system and to a deviation of the origin of a sampling time of the nuclear magnetic resonance signal;

means for converting the phase angle, having the influence of the phase shift eliminated, into an image signal intensity; and displaying the image signal intensity as an image including displaying an image in response to a real part of the image signal intensity.

30. An imaging apparatus according to claim 29, wherein the means for eliminating an influence of a phase shift eliminates an influence of a phase shift due to at least both a characteristic of the detection system and to a deviation of the origin of a sampling time of the nuclear magnetic resonance signal.

31. An imaging apparatus according to any one of claims 25, 27 or 29, wherein the means for displaying displays information regarding movement of the object which is included in the phase angle calculated from the image signal of the complex number as the image.

32. An imaging apparatus according to any one of claims 25, 27 or 29 wherein the means for eliminating an influence of a phase shift eliminates an influence of a phase shift due to unevenness of a magnetic field.

* * * * *